(12) United States Patent
Lee

(10) Patent No.: US 10,741,482 B2
(45) Date of Patent: Aug. 11, 2020

(54) SEMICONDUCTOR DEVICE PACKAGE

(71) Applicant: Advanced Semiconductor Engineering, Inc., Kaohsiung (TW)

(72) Inventor: Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/858,939

(22) Filed: Dec. 29, 2017

(65) Prior Publication Data

US 2019/0206775 A1    Jul. 4, 2019

(51) Int. Cl.
| | | |
|---|---|---|
| H01L 23/498 | (2006.01) | |
| H01L 23/495 | (2006.01) | |
| H01L 23/00 | (2006.01) | |
| H01L 21/48 | (2006.01) | |
| H01L 23/31 | (2006.01) | |
| H01L 25/10 | (2006.01) | |

(52) U.S. Cl.
CPC .... *H01L 23/49811* (2013.01); *H01L 21/4853* (2013.01); *H01L 21/4857* (2013.01); *H01L 23/3128* (2013.01); *H01L 23/49517* (2013.01); *H01L 23/49822* (2013.01); *H01L 23/49866* (2013.01); *H01L 24/16* (2013.01); *H01L 24/29* (2013.01); *H01L 24/32* (2013.01); *H01L 23/49816* (2013.01); *H01L 24/13* (2013.01); *H01L 25/10* (2013.01); *H01L 2224/13147* (2013.01); *H01L 2224/16225* (2013.01); *H01L 2224/16237* (2013.01); *H01L 2224/29298* (2013.01); *H01L 2224/32227* (2013.01); *H01L 2224/8185* (2013.01); *H01L 2225/1058* (2013.01); *H01L 2924/15311* (2013.01); *H01L 2924/181* (2013.01); *H01L 2924/19105* (2013.01)

(58) Field of Classification Search
CPC ..... H01L 24/16; H01L 23/3128; H01L 24/32; H01L 24/29; H01L 25/10; H01L 2225/1058; H01L 2224/32227; H01L 2224/16237; H01L 2224/29298
See application file for complete search history.

(56) References Cited

U.S. PATENT DOCUMENTS

| | | | |
|---|---|---|---|
| 2014/0327133 A1 | 11/2014 | Lin | |
| 2015/0000959 A1* | 1/2015 | Su | H05K 3/4614 174/251 |
| 2016/0111384 A1* | 4/2016 | Tseng | H01L 23/3142 257/737 |

FOREIGN PATENT DOCUMENTS

| | | |
|---|---|---|
| CN | 104143538 A | 11/2014 |
| CN | 106356435 A | 1/2017 |

* cited by examiner

*Primary Examiner* — Thanh Y. Tran
(74) *Attorney, Agent, or Firm* — Foley & Lardner LLP

(57) ABSTRACT

A semiconductor device package includes a carrier, a first conductive post and a first adhesive layer. The first conductive post is disposed on the carrier. The first conductive post includes a lower surface facing the carrier, an upper surface opposite to the lower surface and a lateral surface extended between the upper surface and the lower surface. The first adhesive layer surrounds a portion of the lateral surface of the first conductive post. The first adhesive layer comprises conductive particles and an adhesive. The first conductive post has a height measured from the upper surface to the lower surface and a width. The height is greater than the width.

16 Claims, 6 Drawing Sheets

SEMICONDUCTOR DEVICE PACKAGE

BACKGROUND

1. Technical Field

The present disclosure relates to a semiconductor device package and a method of manufacturing the same.

2. Description of the Related Art

A conductive post in a semiconductor device package may move, tilt or fall because solder material between the conductive post and a conductive pad (of a substrate) is melted during thermal cycles in a process of manufacturing the semiconductor device package. The moved, tilted or fell conductive post may cause reliability issues of the semiconductor device package.

SUMMARY

In one or more embodiments, a semiconductor device package includes a carrier, a first conductive post and a first adhesive layer. The first conductive post is disposed on the carrier. The first conductive post includes a lower surface facing the carrier, an upper surface opposite to the lower surface and a lateral surface extended between the upper surface and the lower surface. The first adhesive layer surrounds a portion of the lateral surface of the first conductive post. The first adhesive layer comprises conductive particles and an adhesive. The first conductive post has a height measured from the upper surface to the lower surface and a width. The height is greater than the width.

In one or more embodiments, a semiconductor device package includes a carrier, a conductive post, a first adhesive layer and an insulating layer. The conductive post is disposed on the carrier and including a lateral surface. The first adhesive layer surrounds a portion of the lateral surface of the conductive post. The first adhesive layer includes conductive particles and an adhesive. The insulating layer encapsulates the conductive post and exposes an external contact of the conductive post.

In one or more embodiments, a method for manufacturing a semiconductor device includes disposing an adhesive layer comprising conductive particles and an adhesive on a carrier; disposing a pretreated or preformed conductive post on the adhesive layer; and curing the adhesive layer.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1:
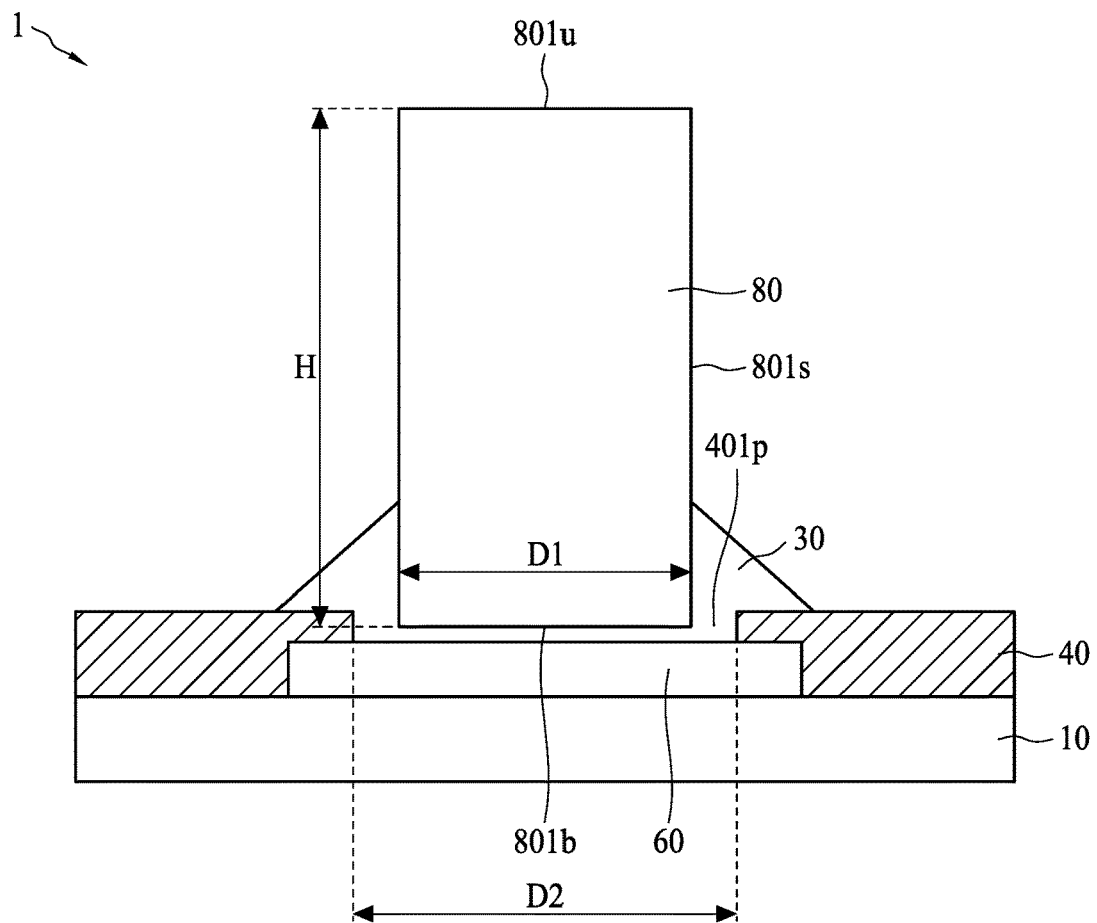
FIG. 1 is a cross-sectional view of a semiconductor device package in accordance with some embodiments of the present disclosure.

FIG. 1 is a cross-sectional view of a semiconductor device package 1 in accordance with some embodiments of the present disclosure. The semiconductor device package 1 includes a carrier 10, an adhesive layer 30, a dielectric layer 40, a pad 60 and a conductive post 80. The adhesive layer 30 may include, e.g., conductive glue.

The conductive post 80 is disposed on the carrier 10. The conductive post 80 may be, or include, a pre-formed conductive post. The conductive post 80 includes a lower surface 801b facing the carrier 10, an upper surface 801u opposite to the lower surface 801b and a lateral surface 801s extended between the upper surface 801u and the lower surface 801b. In some embodiments, the dielectric layer 40 includes Polypropylene (PP), Polyimide (PI), Ajinomoto Build-up Film (ABF), other suitable insulating materials, or a combination of two or more thereof.

In some embodiments, the carrier 10 includes silicon (Si), ceramic, glass, metal, other suitable inorganic materials or a combination of two or more thereof. The carrier 10 may be a substrate, a wafer, or a lead frame. In some embodiments, each of the pad 60 and the conductive post 80 includes, for example, copper (Cu), other metal, a metal alloy, other conductive material, or a combination of two or more thereof. The adhesive layer 30 surrounds a portion of the lateral surface 801s of the conductive post 80. In some embodiments, the adhesive layer 30 includes a conductive filler such as conductive particles (such as gold (Au), silver (Ag), Cu, another metal, a metal alloy, or other conductive material) and an adhesive (such as epoxy resin or other resin).

In some embodiments, a thermal degradation temperature (Td) of the adhesive of the adhesive layer 30 may be higher than a reflow temperature in a reflow process. A melting temperature of the adhesive of the adhesive layer 30 may be higher than the reflow temperature in the reflow process. For example, the melting temperature of the adhesive layer 30 may higher than about 260 Degrees Celsius (° C.). Thus, the adhesive layer 30 may not be melted or reflowed at a working temperature ranging from about 25° C. to about 260° C. during a reflow process. At least a portion of the lateral surface 801s of the conductive post 80 may be surrounded by the adhesive layer 30, which has a relatively high melting point, may fix or support the conductive post 80 during thermal cycles in a process of manufacturing the semiconductor device package 1.

The conductive post 80 has a height H measured from the upper surface 801u to the lower surface 801b. In some embodiments, the height H ranges from about 410 micrometers (μm) to about 490 μm. The conductive post 80 has a width D1. In some embodiments, the width D1 ranges from about 270 μm to about 330 μm. The height H of the conductive post 80 is greater than the width D1 of the conductive post 80. The roughness of the lower surface 801b may be different from the lateral surface 801s. In some embodiments, the roughness of the lower surface 801b is greater than the lateral surface 801s. The ratio of the height H of the conductive post 80 to the width D1 of the conductive post 80 may be equal to or more than about 1.2:1, such as about 1.3:1 or greater, about 1.4:1 or greater, or about 1.5:1 or greater. The relatively great roughness of the lower surface 801b of the conductive post 80 may enhance the adhesion and conductivity between the lower surface 801b and the adhesive layer 30. In some embodiments, a relatively larger sized conductive filler (e.g., conductive particles) of the adhesive layer 30 is in contact with the lower surface 801b and the pad 60. A relatively smaller sized conductive filler of the adhesive layer 30 may be fitted into the uneven surface 801b of the conductive post 80 to mitigate a void issue at the lower surface 801b of the conductive post 80.

The pad 60 is disposed between the carrier 10 and the conductive post 80. The dielectric layer 40 and the pad 60 are disposed on the carrier 10. The dielectric layer 40 defines an opening 401p exposing the pad 60. The pad 60 can be a conductive pad. The conductive post 80 is electrically connected to the pad 60 through the adhesive layer 30. The conductive post 80 is electrically connected to the pad 60 by the adhesive layer 30 in the opening 401p. In some embodiments, the conductive post 80 is not in direct contact with the pad 60, with a gap in between. In some other embodiments, at least a portion of the lower surface 801b is in direct contact with the pad 60.

A difference between a length D2 of the opening 401p of the dielectric layer 40 and a width D1 of the conductive post 80 may be equal to or greater than about 70 μm. The lower surface 801b of the conductive post 80 is disposed within the opening 401p. A portion of the conductive post 80 may be disposed on the dielectric layer 40. The difference between the length D2 of the opening 401p of the dielectric layer 40 and the width D1 of the conductive post 80 may be greater than about 70 μm so that a portion of the lateral surface 801s of the conductive post 80 can be surrounded and supported by the adhesive layer 30.

Figure 2A:
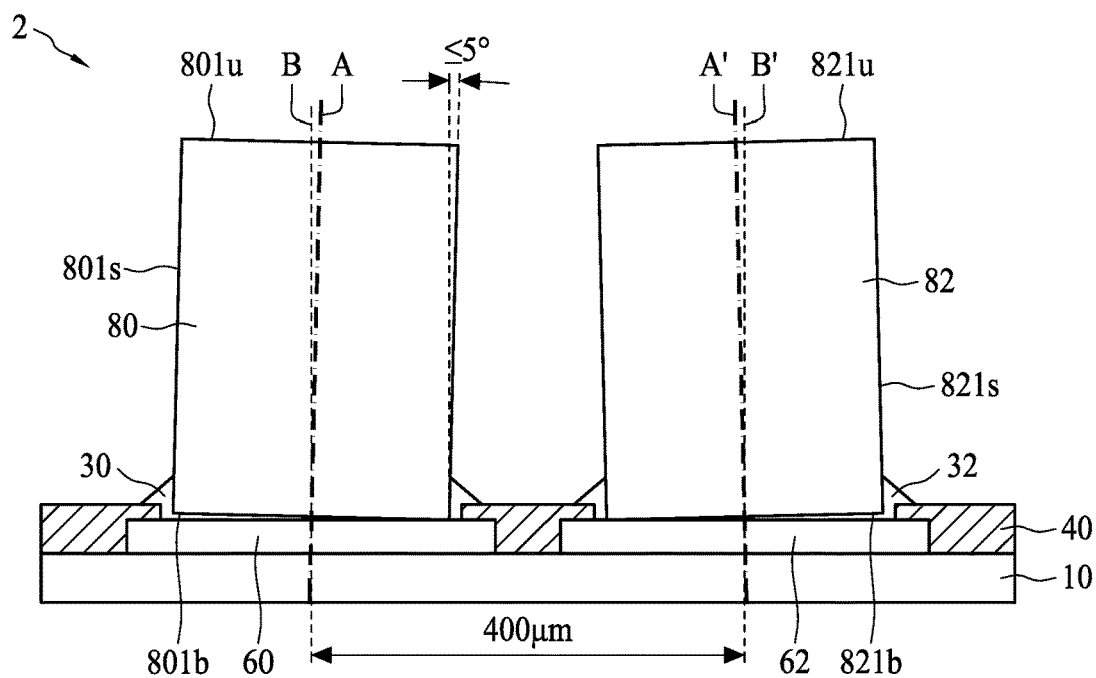
FIG. 2A is a cross-sectional view of a semiconductor device package in accordance with some embodiments of the present disclosure.

In some embodiments, one or more conductive posts may be slightly tilted with respect to a surface normal of a carrier. FIG. 2A is a cross-sectional view of a semiconductor device package 2 in accordance with some embodiments of the present disclosure. The semiconductor device package 2 includes a carrier 10, adhesive layers 30 and 32, a dielectric layer 40, pads 60 and 62 and conductive posts 80 and 82. The adhesive layers 30 may include, e.g., conductive glues.

The conductive posts 80 and 82 are disposed on the carrier 10. The conductive post 80 includes a lower surface 801b facing the carrier 10, an upper surface 801u opposite to the lower surface 801b and a lateral surface 801s extended between the upper surface 801u and the lower surface 801b. Similarly, the conductive post 82 includes a lower surface 821b facing the carrier 10, an upper surface 821u opposite to the lower surface 821b and a lateral surface 821s extended between the upper surface 821u and the lower surface 821b. In some embodiments, the dielectric layer 40 includes PP, PI, ABF, other suitable insulating materials or a combination of two or more thereof. In some embodiments, the carrier 10 includes Si ceramic, glass, metal, other suitable inorganic materials, or a combination of two or more thereof. In some embodiments, each of the pads 60 and 62 and conductive posts 80 and 82 includes for example, Cu, other metal, a metal alloy, other conductive material, or a combination of two or more thereof.

The adhesive layer 30 surrounds a portion of the lateral surface 801s of the conductive post 80. The adhesive layer 32 surrounds a portion of the lateral surface 821s of the conductive post 82. In some embodiments, the adhesive layer 30 includes a conductive filler such as conductive particles (such as Au, Ag or Cu) and an adhesive (such as epoxy resin). At least a portion of the lateral surface 801s of the conductive post 80 may be surrounded by the adhesive layer 30, which has a relatively high melting point, and may fix or support the conductive post 80 during thermal cycles in a process of manufacturing the semiconductor device package 2. Similarly, at least a portion of the lateral surface 821s of the conductive post 82 may be surrounded by the adhesive layer 32, which has a relatively high melting point, and may fix or support the conductive post 82 during the thermal cycles in the process of manufacturing the semiconductor device package 2.

As shown in FIG. 2A, the conductive post 80 has a vertical geometrical central axis A and the pad 60 has a vertical geometrical central axis B. The vertical geometrical central axis B of the pad 60 may be parallel to a surface normal of the carrier 10. The conductive post 82 has a vertical geometrical central axis A' and the pad 62 has a vertical geometrical central axis B'. The vertical geometrical central axis B' of the pad 62 may be parallel to the surface normal of the carrier 10. In some embodiments, a distance (also referred to as pitch) between the vertical geometrical central axis B of the pad 60 and the vertical geometrical central axis B' of the pad 62 may be about 400 μm.

A tilt angle between the vertical geometrical central axis A of the conductive post 80 and the vertical geometrical central axis B of the pad 60 may be equal to or smaller than about 5 degrees, such as about 4 degrees or less, or about 3 degrees or less. A tilt angle between the vertical geometrical central axis A' of the conductive post 82 and the vertical geometrical central axis B' of the pad 62 may be equal to or smaller than about 5 degrees, such as about 4 degrees or less, or about 3 degrees or less. A tilt angle defined by the vertical geometrical central axis A of the conductive post 80 relative to the vertical geometrical central axis B of the pad 60 may be equal or smaller than about 5 degrees and may help to avoid bridge (short circuit) of the adjacent two conductive posts 80 and 82.

Figure 2B:
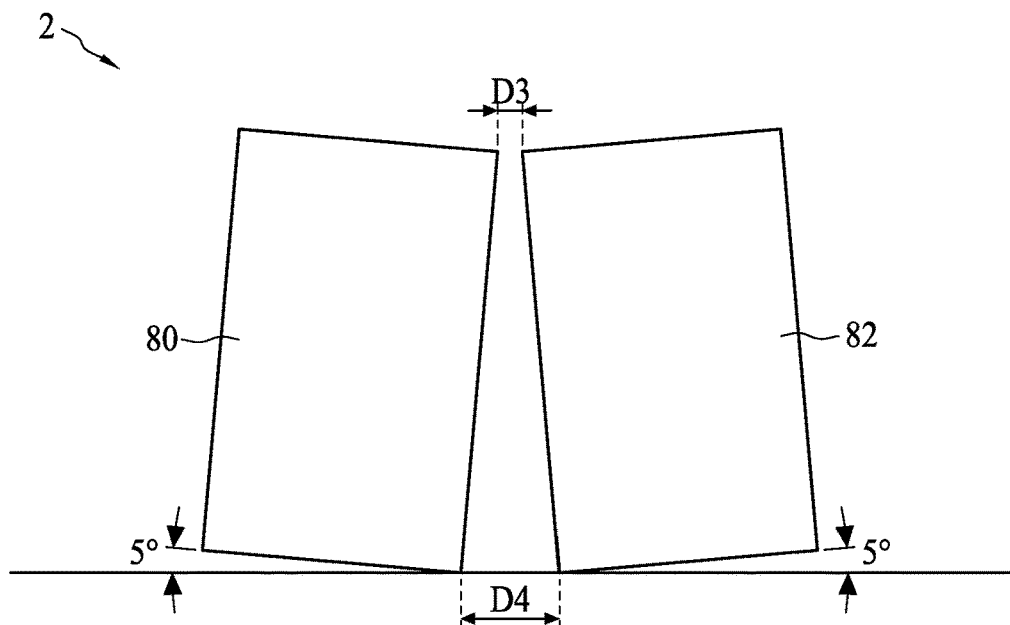
FIG. 2B is a schematic diagram of a cross-sectional view of the semiconductor device package of FIG. 2B.

FIG. 2B is a schematic diagram of a cross-sectional view of a semiconductor device package 2 of FIG. 2A. In some embodiments, the minimum distance D3 between the two conductive posts 80 and 82 of the semiconductor device package 2 may be about 21.56 µm. The distance D4 between the bottom of the two conductive posts 80 and 82 of the semiconductor device package 2 may be about 100 µm.

Figure 3:
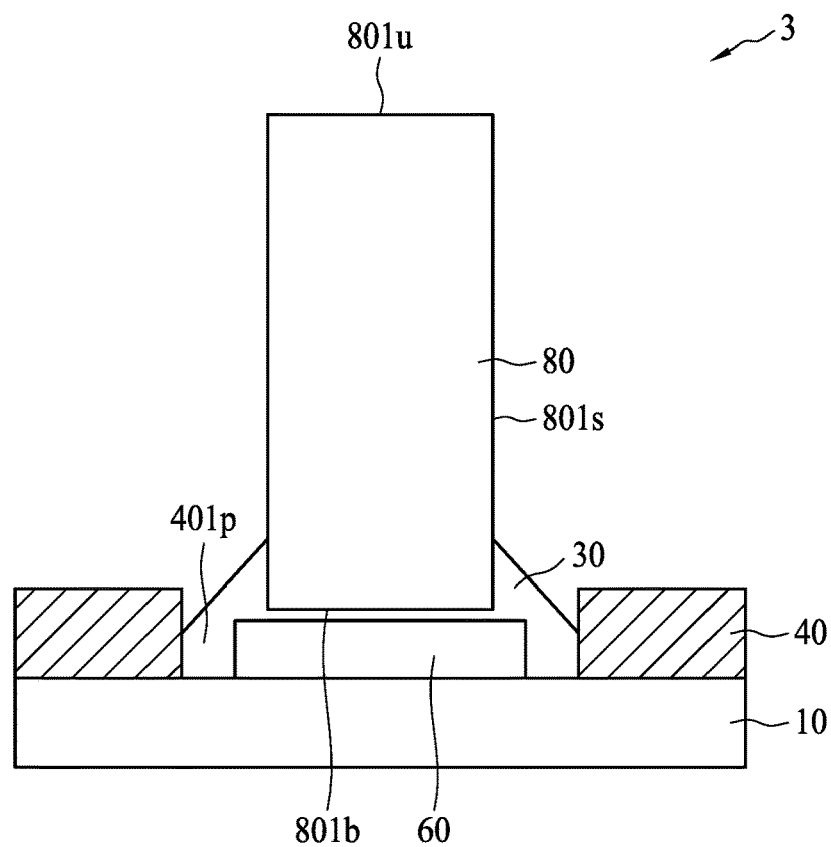
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure. The semiconductor device package 3 is similar to the semiconductor device package 1 of FIG. 1, except that an adhesive layer 30 is not disposed on a top surface of a dielectric layer 40. Some of the same-numbered components are not described again with respect to FIG. 3. The semiconductor device package 3 includes a carrier 10, the adhesive layer 30, the dielectric layer 40, a pad 60 and a conductive post 80.

In some embodiments, the adhesive layer 30 includes a conductive filler such as conductive particles (such as Au, Ag or Cu) and an adhesive (such as epoxy resin). A thermal degradation temperature (Td) of the adhesive of the adhesive layer 30 may be higher than a reflow temperature in a reflow process. A melting temperature of the adhesive of the adhesive layer 30 may be higher than the reflow temperature in the reflow process. For example, the melting temperature of the adhesive layer 30 may be greater than about 260° C. The pad 60 is disposed between the carrier 10 and the conductive post 80. The dielectric layer 40 and the pad 60 are disposed on the carrier 10. The dielectric layer 40 defines an opening 401p exposing the pad 60. The conductive post 80 is electrically connected to the pad 60 through the adhesive layer 30. The conductive post 80 is electrically connected to the pad 60 by the adhesive layer 30 in the opening 401p.

A portion of the lateral surface 801s which is extended between the upper surface 801u and the lower surface 801b may be supported by the adhesive layer 30. The adhesive layer 30 is not disposed on the top surface of the dielectric layer 40. The adhesive layer 30 contacts a portion of a side wall of the opening 401p of the dielectric layer 40.

Figure 4:
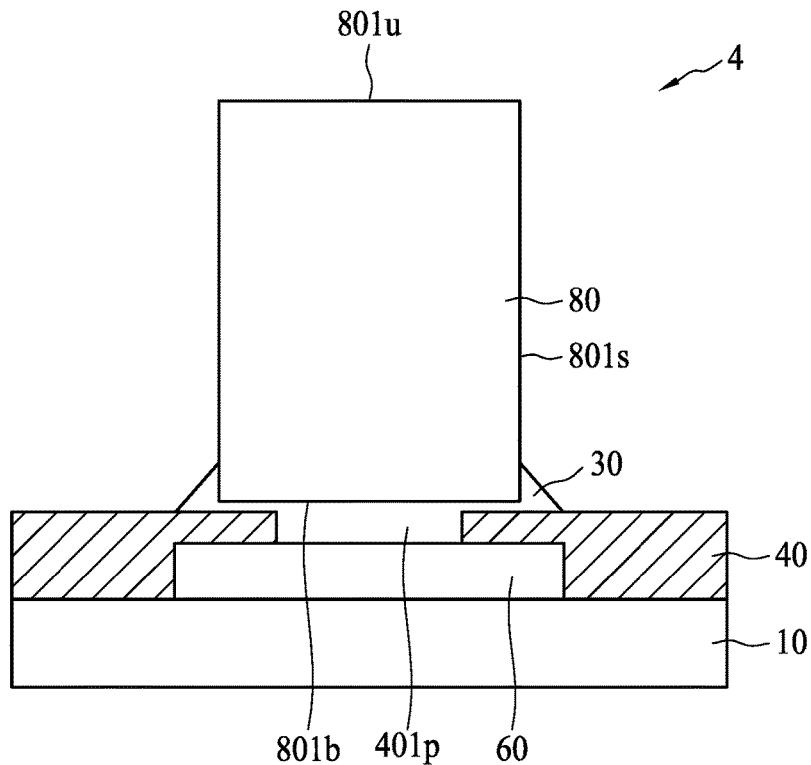
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. The semiconductor device package 4 is similar to the semiconductor device package 1 of FIG. 1, except that a portion of an adhesive layer 30 is disposed on a top surface of a dielectric layer 40. At least some of same-numbered components are not described again with respect to FIG. 4. The semiconductor device package 4 includes a carrier 10, the adhesive layer 30, the dielectric layer 40, a pad 60 and a conductive post 80.

The conductive post 80 is disposed on the carrier 10 and the dielectric layer 40. The conductive post 80 includes a lower surface 801b facing the carrier 10, an upper surface 801u opposite to the lower surface 801b and a lateral surface 801s extended between the upper surface 801u and the lower surface 801b. The adhesive layer 30 surrounds a portion of the lateral surface 801s of the conductive post 80. A portion of the adhesive layer 30 is disposed on the top surface of the dielectric layer 40.

The dielectric layer 40 defines an opening 401p exposing the pad 60. The conductive post 80 is electrically connected to the pad 60 through the adhesive layer 30. The conductive post 80 is disposed above the top surface of the dielectric layer 40. The conductive post 80 is electrically connected to the pad 60 by the adhesive layer 30 in the opening 401p.

Figure 5:
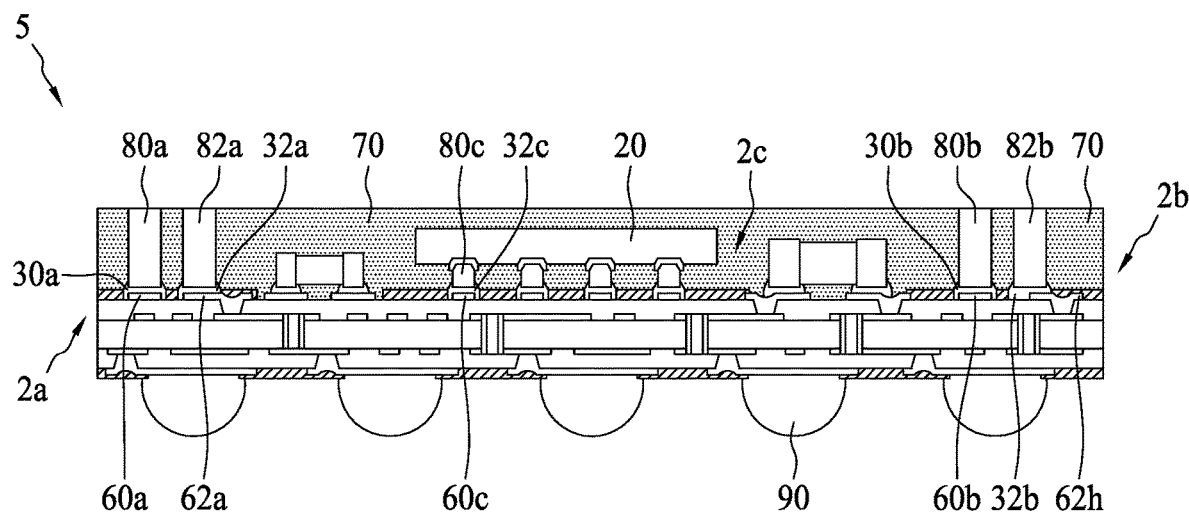
FIG. 5 is a cross-sectional view of a semiconductor device package in accordance with some embodiments of the present disclosure.

FIG. 5 is a cross-sectional view of a semiconductor device package 5 in accordance with some embodiments of the present disclosure. The semiconductor device package 5 includes a semiconductor device package 2a, a semiconductor device package 2b, a semiconductor device package 2c, an electronic component 20, an insulating layer 70 and solder bumps 90.

The semiconductor device packages 2a, 2b and 2c are similar to the semiconductor device package 1 of FIG. 1, and at least some of the same-numbered components are not described again with respect to FIG. 5. The semiconductor device package 2a includes conductive posts 80a and 82a, adhesive layers 30a and 32a, a dielectric layer 40, and pads 60a and 62a. The semiconductor device package 2b includes conductive posts 80b and 82b, adhesive layers 30b and 32b, a dielectric layer 40, and pads 60b and 62b. The semiconductor device package 2c includes conductive posts 80c, an adhesive layer 32c, a dielectric layer 40, and a pad 60c.

The conductive post 80c may be disposed below the electronic component 20. The conductive post 80c is supported by the adhesive layer 32c. The adhesive layer 32c includes a conductive filler and an insulating material. The electronic component 20 is disposed on the carrier 10. The electronic component 10 is adjacent to the conductive posts 80a, 82a, 80b and 82b. The insulating layer 70 encapsulates the electronic component 20 and the conductive posts 80a, 82a, 80b and 82b. For example, the insulating layer 70 encapsulates the conductive posts 80a, 80b, 82a and 82b and exposes the top surfaces of external contacts of the conductive posts 80a, 80b, 82a and 82b. In some embodiments, the roughness of a lower surface of the conductive post 80a corresponding to the adhesive layer 30a is different from the roughness of the lateral surface of the conductive post 80a. The roughness of the lower surface of the conductive post 80a may be greater than the roughness of the lateral surface conductive post 80a. In some embodiments, a tilt angle between a vertical geometrical central axis of the conductive post 80c and a vertical geometrical central axis of the pad 60c may be equal to or smaller than 5 degrees.

Figure 6A:
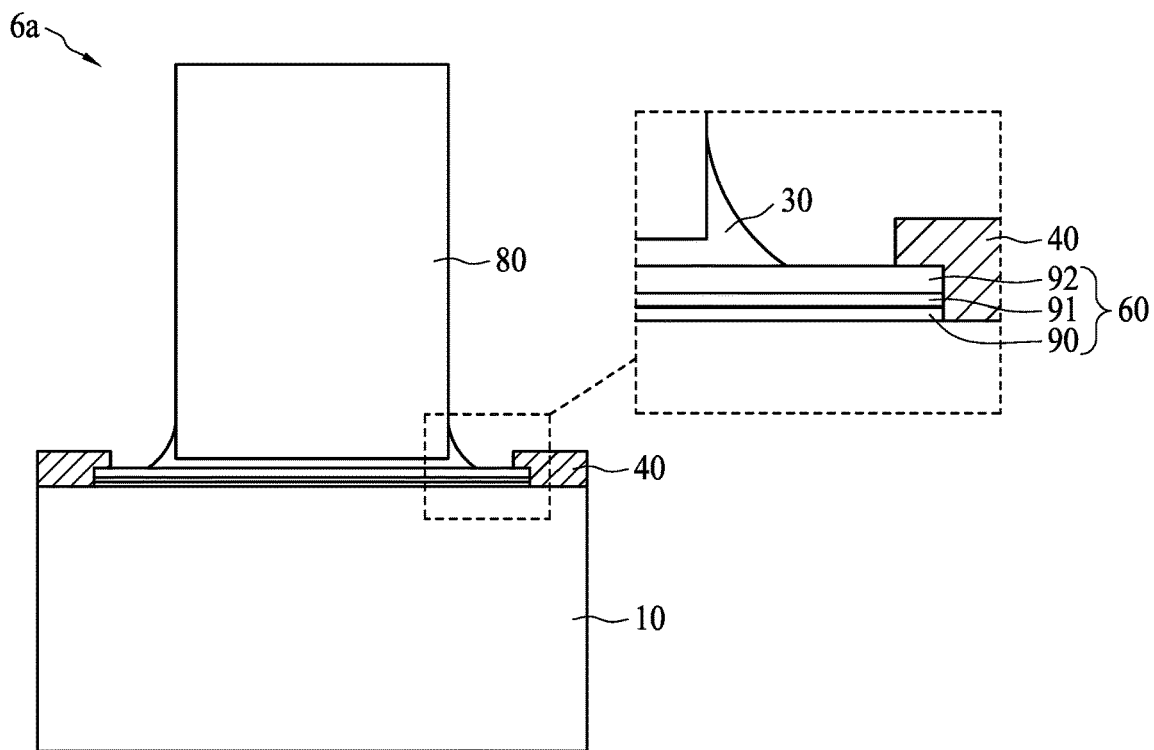
FIG. 6A is a cross-sectional view of a semiconductor device package in accordance with some embodiments of the present disclosure.

FIG. 6A is a cross-sectional view of a semiconductor device package 6a in accordance with some embodiments of the present disclosure. The semiconductor device package 6a is similar to the semiconductor device package 1 of FIG. 1, and some of the same-numbered components are not described again with respect to FIG. 6. The semiconductor device package 6a includes a carrier 10, an adhesive layer 30, a dielectric layer 40, a pad 60 and a conductive post 80.

In some embodiments, the pad 60 includes layers 90, 91 and 92. In some embodiments, the layer 90 may include, for example, aluminum (Al), other metal, a metal alloy, other conductive material, or a combination of two or more thereof. In some embodiments, the layer 91 may include, for example, titanium (Ti), other metal, r a metal alloy, other conductive material, or a combination of two or more thereof. In some embodiments, the layer 92 may include, for example, Cu, other metal, a metal alloy, other conductive material, or a combination of two or more thereof. In some embodiments, the adhesive layer 30 includes a conductive filler such as conductive particles (such as Au, Ag or Cu) and an adhesive (such as epoxy resin). A portion of the lateral surface 801s of the conductive post 80 is supported by the adhesive layer 30. A portion of the lateral surface 801s of the conductive post 80 is surrounded by the adhesive layer 30, which have a relatively high melting point, and may fix or support conductive post 80 during thermal cycles in a process of manufacturing the semiconductor device package 6a.

Figure 6B:
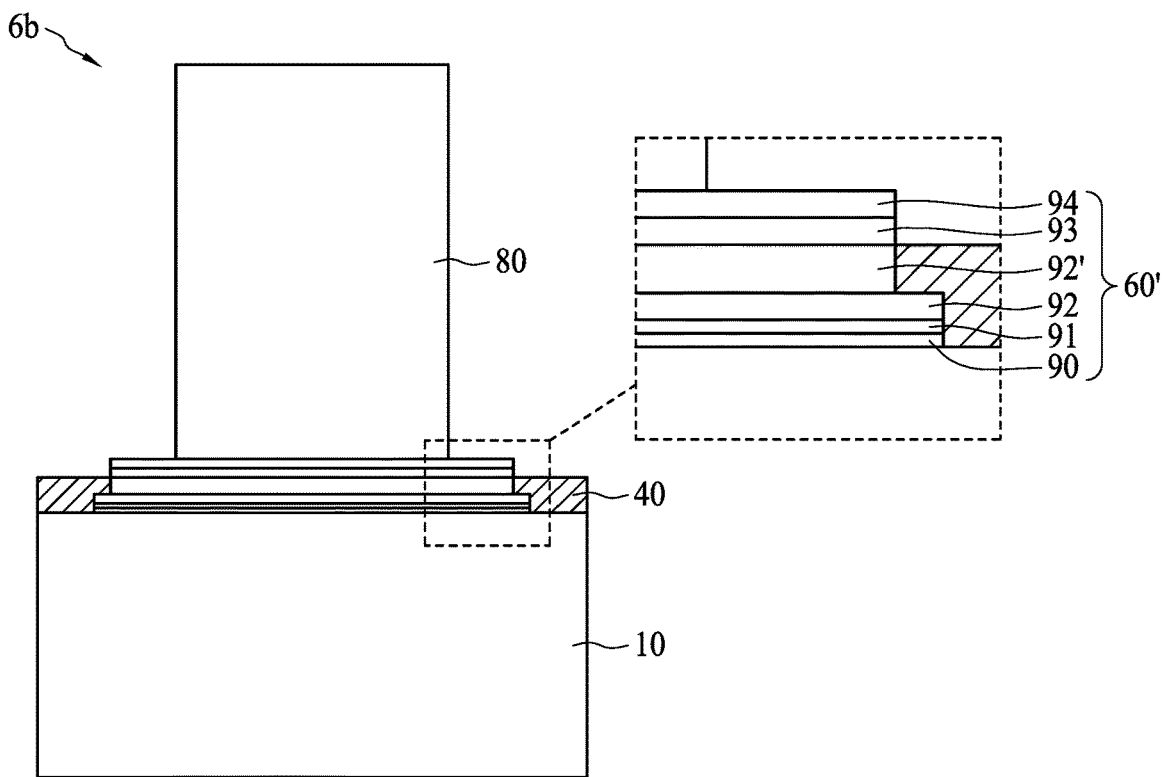
FIG. 6B is a cross-sectional view of a semiconductor device package in accordance with some embodiments of the present disclosure.

FIG. 6B is a cross-sectional view of a semiconductor device package 6b in accordance with some embodiments of the present disclosure. The semiconductor device package 6b is similar to the semiconductor device package 1 of FIG.

1, and some of same-numbered components are not described again with respect to FIG. 6B. The semiconductor device package 6b includes a carrier 10, a dielectric layer 40, a pad 60' and a conductive post 80.

In some embodiments, the pad 60' includes layers 90, 91, 92, 92', 93 and 94. In some embodiments, the layer 90 may include, for example, Al, or other metal, a metal alloy, other conductive material, or a combination of two or more thereof. In some embodiments, the layer 91 may include, for example, Ti, or other metal, a metal alloy, other conductive material, or a combination of two or more thereof. In some embodiments, the layer 92 may be a seed layer including, for example, Cu, or other metal, a metal alloy, other conductive material, or a combination of two or more thereof. In some embodiments, the layer 92' may include, for example, Cu, or other metal, a metal alloy, other conductive material, or a combination of two or more thereof.

In some embodiments, the layer 93 may include, for example, nickel (Ni), or other metal, a metal alloy, other conductive material, or a combination of two or more thereof. In some embodiments, the layer 93 may include, for example, tin (Sn), or other metal, a metal alloy, other conductive material, or a combination of two or more thereof. The layer 93 of Sn has a relatively low melting point. The conductive post 80 may be tilted during thermal cycles in a process of manufacturing the semiconductor device package 6b since the layer 93 may be reflowed.

Figure 7A:
FIG. 7A illustrates one or more stages of a method of manufacturing a semiconductor device package in accordance with some embodiments of the present disclosure.
Figure 7B:
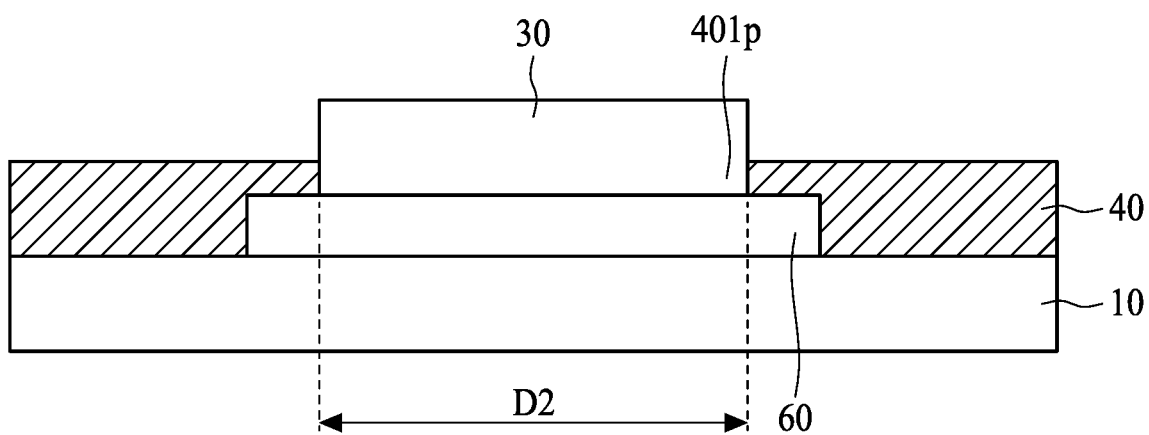
FIG. 7B illustrates one or more stages of a method of manufacturing a semiconductor device package in accordance with some embodiments of the present disclosure.
Figure 7C:
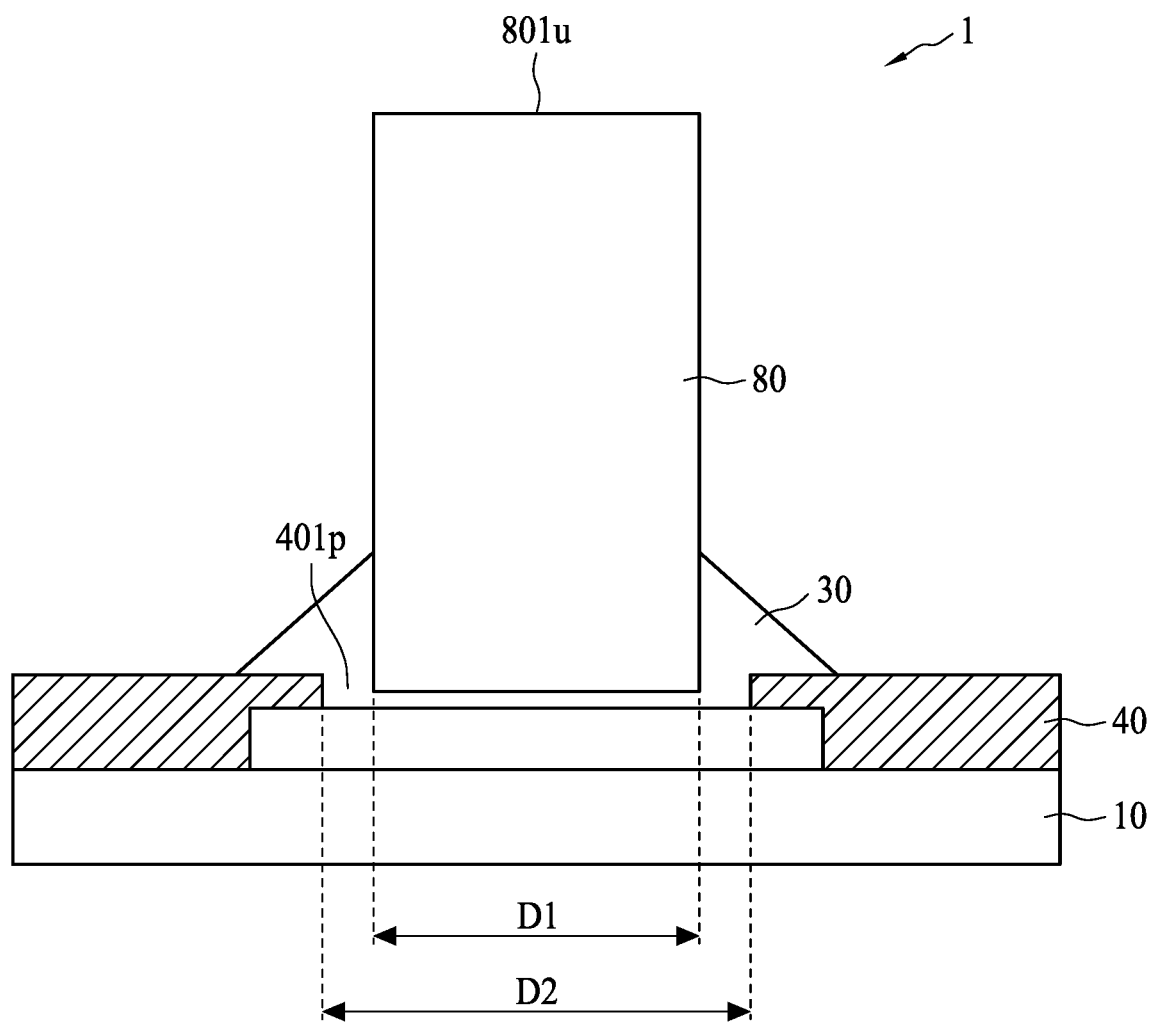
FIG. 7C illustrates one or more stages of a method of manufacturing a semiconductor device package in accordance with some embodiments of the present disclosure.

FIGS. 7A-7C illustrate various stages of a method of manufacturing the semiconductor device package 1. Referring to FIG. 7A, a carrier 10 is provided. In some embodiments, the carrier 10 includes Si, ceramic, glass, metal, other suitable inorganic materials, or a combination of two or more thereof.

Referring to FIG. 7B, a pad 60 is disposed on the top surface of the carrier 10. In some embodiments, the pad 60 include, for example, Cu, or other metal, a metal alloy, other conductive material, or a combination of two or more thereof. A dielectric layer 40 is disposed on the top surface of the carrier 10 and covers at least a portion of the pad 60. In some embodiments, the dielectric layer 40 includes PP, PI, ABF, other suitable insulating materials, or a combination of two or more thereof. The dielectric layer 40 defines an opening 401p exposing the pad 60. The opening 401p of the dielectric layer 40 has a length D2. An adhesive layer 30 is disposed in the opening 401p and protrudes from the top surface of the dielectric layer 40. In some embodiments, the adhesive layer 30 includes a conductive filler such as conductive particles (such as Au, Ag or Cu) and an adhesive (such as epoxy resin). The disposing of the adhesive layer may include providing a stencil to print the adhesive layer 30 on the pad 60 of the carrier 10 with a pattern defined by the stencil. The stencil may include an opening to align the pretreated conductive post 80 to connect the adhesive layer 30 through the opening of the stencil.

A thermal degradation temperature (Td) of the adhesive of the adhesive layer 30 may be higher than a reflow temperature in a reflow process. A melting temperature of the adhesive of the adhesive layer 30 of the adhesive layer 30 may be higher than the reflow temperature in the reflow process. In some embodiments, the melting temperature of the adhesive layer 30 may be greater than about 260° C.

Referring to FIG. 7C, a pretreated or preformed conductive post 80 is disposed on the adhesive layer 30. The disposing of the pretreated conductive post 80 may include pressing the pretreated conductive post 80 into the adhesive layer 30 before the curing of the adhesive layer 30. In some embodiments, the conductive post 80 include, for example, Cu, other metal, a metal alloy, other conductive material, or a combination of two or more thereof. The lower surface 801b of the conductive post 80 is rough. The lower surface 801b of the conductive post 80 may have some small voids thereon. At least a portion of the adhesive layer 30 may be filled into the voids of the lower surface 801b. A relatively smaller sized conductive filler of the adhesive layer 30 may be fitted into the uneven surface 801b of the conductive post 80 to mitigate the void issue. The relatively great roughness of the lower surface 801b of the conductive post 80 may enhance the adhesion and conductivity between the lower surface 801b and the adhesive layer 30. A relatively greater sized conductive filler of the adhesive layer 30 is in contact with the lower surface 801b and the pad 60. After disposing the conductive post 80 into the adhesive layer 30, the adhesive layer 30 is cured (e.g., hardened). Next, the semiconductor device package 1 of FIG. 1 is obtained. A portion of the lateral surface 801s of the conductive post 80 is surrounded by the adhesive layer 30, which have a relatively high melting point, and may fix or support conductive post 80 during thermal cycles in a process of manufacturing the semiconductor device package 1.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a carrier including a first surface;
    a first conductive post disposed on the first surface of the carrier, the first conductive post including a lower surface facing the carrier, an upper surface opposite to the lower surface and a lateral surface extended between the upper surface and the lower surface; and
    a first adhesive layer in contact with the first conductive post and the first surface of the carrier, the first adhesive layer comprising conductive particles and an adhesive;
    wherein a portion of the first surface of the carrier is exposed from the first adhesive layer.

2. The semiconductor device package of claim 1, wherein a roughness of the lower surface is different from a roughness of the lateral surface.

3. The semiconductor device package of claim 1, wherein a roughness of the lower surface is greater than a roughness of the lateral surface.

4. The semiconductor device package of claim 1, further comprising a pad disposed between the carrier and the first conductive post, and wherein a tilt angle between a vertical geometrical central axis of the first conductive post and a vertical geometrical central axis of the pad is equal to or smaller than 5 degrees.

5. The semiconductor device package of claim 1, further comprising a dielectric layer and a pad disposed on the carrier, wherein the dielectric layer defines an opening exposing the pad, and the first conductive post is electrically connected to the pad through the first adhesive layer.

6. The semiconductor device package of claim 5, wherein a difference between a length of the opening of the dielectric layer and the width of the first conductive post is equal to or greater than 70 micrometer (μm).

7. The semiconductor device package of claim 5, wherein the lower surface of the first conductive post is disposed within the opening.

8. The semiconductor device package of claim 5, wherein a portion of the first conductive post is disposed on the dielectric layer, and the first conductive post is electrically connected to the pad through the first adhesive layer in the opening.

9. The semiconductor device package of claim 1, wherein a ratio of a height of the first conductive post to a width of the first conductive post is equal to or more than 1.2:1.

10. The semiconductor device package of claim 1, wherein a thermal degradation temperature of the adhesive of the first adhesive layer is higher than a reflow temperature in a reflow process.

11. The semiconductor device package of claim 10, wherein a melting temperature of the adhesive of the adhesive layer is higher than a reflow temperature in a reflow process.

12. The semiconductor device package of claim 11, wherein the melting temperature is higher than 260 Degrees Celsius (° C.).

13. The semiconductor device package of claim 1, wherein the carrier is a substrate, a wafer or a lead frame.

14. The semiconductor device package of claim 1, further comprising:
    an electronic component disposed on the carrier, the electronic component adjacent to the first conductive post; and
    an insulating layer encapsulating the electronic component and the first conductive post.

15. The semiconductor device package of claim 14, further comprising a second conductive post disposed below the electronic component, and a second adhesive layer surrounding a portion of a lateral surface of the second conductive post, wherein the second adhesive layer includes a conductive filler and an insulating material.

16. The semiconductor device package of claim 1, wherein the first adhesive layer surrounds a portion of the lateral surface of the first conductive post.

* * * * *